United States Patent
Otani et al.

(10) Patent No.: US 9,647,614 B2
(45) Date of Patent: May 9, 2017

(54) POWER AMPLIFIER

(71) Applicant: Yamaha Corporation, Hamamatsu-shi, Shizuoka (JP)

(72) Inventors: Yohei Otani, Hamamatsu (JP); Masao Noro, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 14/802,412

(22) Filed: Jul. 17, 2015

(65) Prior Publication Data

US 2016/0020735 A1    Jan. 21, 2016

(30) Foreign Application Priority Data

Jul. 18, 2014   (JP) ................. 2014-148293

(51) Int. Cl.
*H03F 3/217*   (2006.01)
*H03F 1/34*    (2006.01)
(Continued)

(52) U.S. Cl.
CPC ............ *H03F 1/342* (2013.01); *H03F 3/185* (2013.01); *H03F 3/2171* (2013.01); *H03F 3/45475* (2013.01); *H03F 2200/03* (2013.01); *H03F 2200/129* (2013.01); *H03F 2200/144* (2013.01); *H03F 2200/153* (2013.01); *H03F 2200/171* (2013.01); *H03F 2200/301* (2013.01); *H03F 2200/351* (2013.01); *H03F 2200/391* (2013.01); *H03F 2200/462* (2013.01); *H03F 2200/546* (2013.01); *H03F 2200/78* (2013.01); *H03F 2203/45521* (2013.01); *H03F 2203/45522* (2013.01); *H03F 2203/45526* (2013.01); *H03F 2203/45528* (2013.01)

(58) Field of Classification Search
CPC ......................................... H03F 3/217
USPC ........................................ 330/10, 251, 207 A
See application file for complete search history.

(56) References Cited

U.S. PATENT DOCUMENTS 4,393,353 A * 7/1983 Minagawa ................ H03F 1/34
                                                    330/102
5,068,903 A    11/1991 Walker
(Continued)

FOREIGN PATENT DOCUMENTS

JP        07-131272 A      5/1995
WO    WO 03/090343 A2    10/2003

OTHER PUBLICATIONS

European Search Report issued in European counterpart Application No. 15177394.2 dated Nov. 16, 2015 (Eleven (11) pages).
(Continued)

*Primary Examiner* — Khanh V Nguyen
*Assistant Examiner* — Khiem Nguyen
(74) *Attorney, Agent, or Firm* — Crowell & Moring LLP

(57) ABSTRACT

A power amplifier includes a class D amplification section and a load current feedback circuit. The class D amplification section includes an input section and a switching section serving as an output stage and switched depending on a signal input to the input section, and outputs current from a power source to a load via the switching section. The load current feedback circuit negatively feeds back the current flowing in the load to the input section of the class D amplification section.

5 Claims, 6 Drawing Sheets

(51) Int. Cl.
*H03F 3/45* (2006.01)
*H03F 3/185* (2006.01)

(56) References Cited

U.S. PATENT DOCUMENTS

| | | |
|---|---|---|
| 7,924,091 B2 | 4/2011 | Horbach et al. |
| 8,224,009 B2 | 7/2012 | Delpapa et al. |
| 2005/0134374 A1 | 6/2005 | Hench et al. |
| 2005/0162228 A1 | 7/2005 | Putzeys |
| 2013/0136278 A1 | 5/2013 | Quilter |

OTHER PUBLICATIONS

Jeong, et al. "A Class D Switching Power Amplifier with High Efficiency and Wide Bandwidth by Dual Feedback Loops", International Conference on Consumer Electronics—Digest of Technical Papers. Rosemont, Jun. 7-9, 1995, New York, IEEE, US, vol. Conf. 14, pp. 428-429, XP000547882 (Two (2) pages).

Japanese Office Action corresponding to Japanese Appl. No. 2014-148293, dated Feb. 14, 2017 with English translations (4 pages).

* cited by examiner

IMPEDANCE CURVE OF SPEAKER

POWER AMPLIFIER

CROSS REFERENCE TO RELATED APPLICATIONS

This application is based on Japanese Patent Application (No. 2014-148293) filed on Jul. 18, 2014, the contents of which are incorporated herein by reference.

BACKGROUND OF THE INVENTION

1. Field of the Invention

The present invention relates to a power amplifier, more particularly, to a power amplifier suitable as a guitar amplifier.

2. Description of the Related Art

In recent years, power amplifiers, such as class D amplifiers, utilizing semiconductor devices have been widespread as audio power amplifiers. For example, in a class D amplifier, the output-stage transistor thereof is turned ON/OFF by a PWM pulse train having been pulse-width modulated on the basis of an input audio signal AIN, and the current from a power source is supplied to a speaker via this output-stage transistor. Since the output impedance of this class D amplifier is very low and consequently the loss of the output-stage transistor is very small, the amplifier can efficiently supply electric power to the speaker. More specifically, the output impedance of the class D amplifier is nearly 0 Ω while the internal impedance of the speaker is approximately 8 to 16 Ω. Furthermore, usually in the class D amplifier, the voltage applied to the speaker is negatively fed back to the input section, and the gain of the class D amplifier is controlled depending on the difference between the input audio signal and the negative feedback signal thereof. Hence, the class D amplifier can perform constant voltage drive in which the voltage corresponding to the input audio signal is supplied to the speaker. For example, WO2003/090343 is available as a prior art document relating to the class D amplifier.

Even in the present day in which such power amplifiers utilizing semiconductor devices as those described above have been widespread, many vacuum tube amplifiers are still used as guitar amplifiers for amplifying the output signals of electric guitars. This is because such vacuum tube amplifiers can emit sound with quality preferred by performers at a large volume from a speaker in comparison with the power amplifiers utilizing semiconductor devices. The following points are taken into consideration as the reasons for this.

FIG. 10 is a graph illustrating the frequency characteristics of the impedance of a full-range speaker. This speaker generally has a resonance frequency (f0) at a frequency of approximately 80 to 100 Hz, and the impedance of the speaker becomes high at this resonance frequency (f0). Furthermore, since the frequency band near the resonance frequency (f0) corresponds to the pitches generated from the fifth and sixth strings of an electric guitar, the frequency band is an important frequency band affecting the sound quality of the electric guitar.

In the case of a power amplifier in which the output voltage is negatively fed back, such as a class D amplifier, that is, in the case of a power amplifier for driving a speaker at a constant voltage, the speaker is driven at a voltage corresponding to an input audio signal without being affected by the frequency characteristics of the impedance of the speaker. Hence, as shown in FIG. 11A, since the speaker is driven at a constant voltage even in the frequency band near the resonance frequency (f0) in which the impedance of the speaker is high, the vibration amplitude of the speaker is constant and the amplitude of the sound to be emitted from the speaker is also maintained constant.

On the other hand, in the case of a vacuum tube amplifier, a pentode is generally used as an amplifying device for output, and this pentode has a characteristic of high output impedance. Furthermore, in a vacuum tube amplifier using the pentode with the high output impedance, the speaker is driven by a constant current corresponding to the input signal supplied to the grid of the vacuum tube, regardless of fluctuations in the impedance of the speaker. Hence, in the frequency band near the resonance frequency (f0) at which the impedance of the speaker becomes high, the voltage of the vacuum tube amplifier for driving the speaker increases as shown in FIG. 11B, whereby the vibration amplitude of the speaker increases and the amplitude of the sound to be emitted from the speaker also increases. As a result, the sound generated from the fifth and sixth strings of the electric guitar has powerful and characteristic sound quality and is persistently favored by performers. For example, in the case that the speaker is driven by a vacuum tube amplifier with a maximum output of 100 W, a peak voltage close to 90 V is applied to the speaker in the frequency band near the resonance frequency (f0), whereby powerful sound can be emitted at a large volume.

For example, in order that a speaker is driven by a class D amplifier and that a sufficient load current is supplied to the speaker in the frequency band near the resonance frequency (f0), it is necessary to use a high output class D amplifier having a high power source voltage at its output stage. However, in the case that the speaker is driven by such a high output class D amplifier, constant voltage drive is performed even in a frequency band in which the impedance of the speaker is low, whereby excessive current flows in the speaker and the speaker may be broken.

As described above, such a vacuum tube amplifier has excellent advantages as a guitar amplifier. However, the vacuum tube amplifier is large in size and heavy in weight, thereby being inconvenient in handling. Furthermore, a pentode having high output impedance is used as the output stage in the vacuum tube amplifier, the loss in the output stage is large, and there is a problem of being unable to efficiently drive a load (speaker).

SUMMARY OF THE INVENTION

The present invention has been made in consideration of the above-mentioned circumstances, and an object of the present invention is to provide a power amplifier capable of supplying a sufficient load current to a load (speaker to be driven) throughout the entire frequency band while making use of the advantage of a class D amplifier in which the loss in the output stage thereof is small.

The present invention provides a power amplifier: comprising:

a class D amplification section that includes an input section and a switching section serving as an output stage and switched depending on a signal input to the input section, and that outputs current from a power source to a load via the switching section; and a load current feedback circuit that negatively feeds back the current flowing in the load to the input section of the class D amplification section.

With the present invention, since the class D amplification section is used, a loss of the output stage of the power amplifier can be decreased. Furthermore, since the current flowing in the load is negatively fed back to the input section of the class D amplification section, a constant drive current can be supplied to the load regardless of the frequency of a current for driving the load.

DETAILED DESCRIPTION OF THE EXEMPLARY EMBODIMENTS

Figure 1:
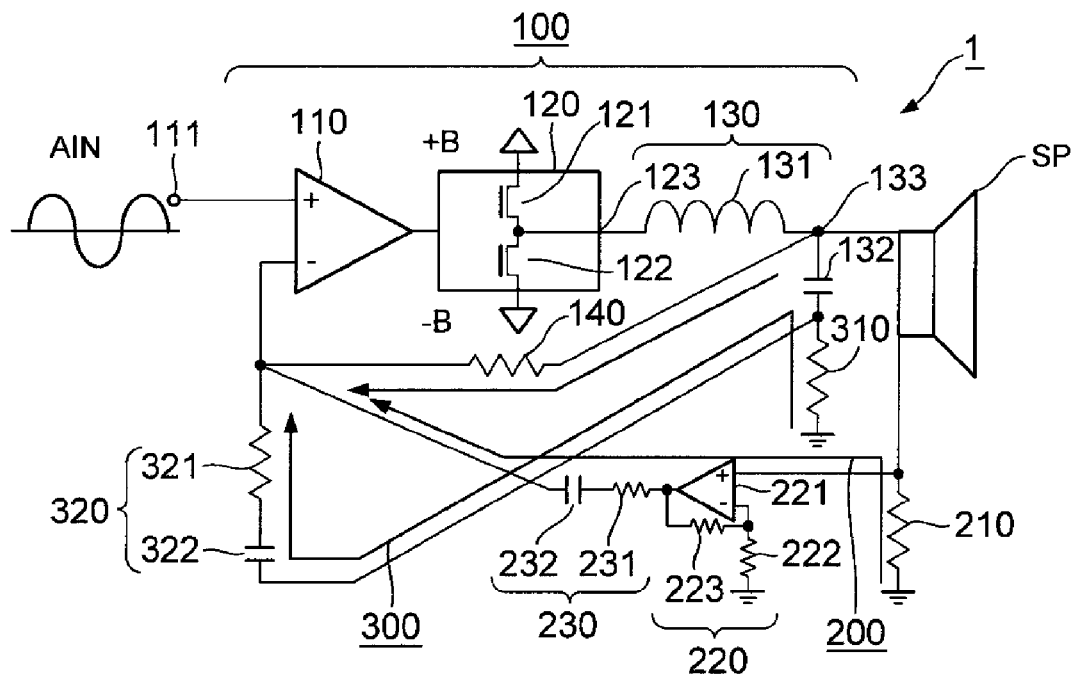
FIG. 1 is a circuit diagram showing a configuration of a power amplifier according to a first embodiment of the present invention.

Embodiments according to the present invention will be described below referring to the drawings.

<First Embodiment>

FIG. 1 is a circuit diagram showing a configuration of a power amplifier 1 according to a first embodiment of the present invention. In FIG. 1, a speaker SP serving as the load of the power amplifier 1 is also shown to facilitate understanding of the configuration of the power amplifier 1.

As shown in FIG. 1, the power amplifier 1 has a class D amplification section 100. This class D amplification section 100 has an operational amplifier (or a comparator) 110, an output stage 120, a filter 130, and a feedback resistor 140.

The operational amplifier 110 is a circuit serving as an input section for the input signal of the class D amplification section 100. An audio signal AIN is input to the non-inverting input terminal of the operational amplifier 110 via an input terminal 111. The power amplifier 1 according to this embodiment is, for example, used as an electric guitar amplifier. In this case, the output signal of an electric guitar is input to the non-inverting input terminal of the operational amplifier 110 as the audio signal AIN.

The output stage 120 has a transistor 121 serving as a switching device and inserted between a positive power source +B and the output terminal 123 of the output stage 120 and a transistor 122 serving as a switching device and inserted between a negative power source −B and the output terminal 123 of the output stage 120. For example, each of the transistors 121 and 122 is a MOS FET (Metal Oxide Semiconductor Field Effect Transistor). In the output stage 120, depending on the output signal of the operational amplifier 110, the transistor 121 is turned ON and the transistor 122 is turned OFF, whereby the positive power source +B is connected to the output terminal 123, or transistor 121 is turned OFF and the transistor 122 is turned ON, whereby the negative power source −B is connected to the output terminal 123. Hence, the waveform of the output signal of the output stage 120 becomes a rectangular wave.

The filter 130 is a low-pass filter for eliminating high-frequency components higher than those of the audio frequency band from the output signal of the output stage 120 and for supplying the remaining frequency components of the audio frequency band to the speaker SP. The filter 130 has an inductor 131 and a capacitor 132. The inductor 131 is inserted between the output terminal 123 of the output stage 120 and one terminal of the speaker SP. Furthermore, one terminal of the capacitor 132 is connected to the node 133 between the inductor 131 and the speaker SP, and the other terminal thereof is grounded via the current detection resistor 310 of a filter current feedback circuit 300. In other words, the capacitor 132 is connected in parallel with the speaker SP serving as a load. The filter current feedback circuit 300 will be described later.

The feedback resistor 140 is inserted between the inverting input terminal of the operational amplifier 110 and the node 133 between the inductor 131 and the speaker SP. The feedback resistor 140 constitutes a self-oscillating feedback loop for making the class D amplification section 100 perform self-oscillation by feeding back the output voltage for the speaker SP to the operational amplifier 110 serving as the input section of the class D amplification section 100. While oscillating at a predetermined self-oscillation frequency, the class D amplification section 100 outputs a PWM pulse train having been pulse-width modulated on the basis of the input audio signal AIN from the output stage 120. The filter 130 plays a role of eliminating high-frequency components higher than the self-oscillation frequency from the PWM pulse train and supplying the remaining frequency components to the speaker SP. The above is the configuration of the class D amplification section 100.

In the power amplifier 1 according to this embodiment, a load current feedback circuit 200 and the filter current feedback circuit 300 are connected to the class D amplification section 100.

The load current feedback circuit 200 is a circuit for negatively feeding back the load current flowing in the speaker SP serving as the load of the class D amplification section 100 to the operational amplifier 110 serving as the input section. The load current feedback circuit 200 has a current detection resistor 210, an amplification section 220, and a connection section 230.

The current detection resistor 210 is connected between a grounding wire and the terminal of the speaker SP on the opposite side of the node 133. The amplification section 220 is composed of an operational amplifier 221 and resistors 222 and 223. The inverting input terminal of the operational amplifier 221 is grounded via the resistor 222 and is connected to the output terminal of the operational amplifier 221 via the resistor 223. Furthermore, the voltage across both the terminals of the current detection resistor 210 is applied to the non-inverting input terminal of the operational amplifier 221. Hence, in the case that the resistance value of the resistor 222 is Ra and that resistance value of the resistor 223 is Rb, the voltage across both the terminals of the current detection resistor 210 is amplified by the gain of (Ra+Rb)/Ra and then output. Since the voltage across both the terminals of the current detection resistor 210 is amplified to a sufficiently high voltage by the amplification section 220 in this embodiment, the resistance value of the current detection resistor 210 can be made small. The connection section 230 is composed of a resistor 231 and a capacitor 232 inserted in series between the output terminal of the amplification section 220 and the inverting input terminal of the operational amplifier 110. The connection section 230 plays a role of adjusting the frequency characteristics of the feedback amount of the negative feedback performed via the load current feedback circuit 200.

The filter current feedback circuit 300 is a circuit for negatively feeding back the current flowing in the capacitor 132 of the filter 130 to the operational amplifier 110 serving as the input section of the class D amplification section 100 and is composed of the above-mentioned current detection resistor 310 and a connection section 320. The connection section 320 is herein composed of a resistor 321 and a capacitor 322 inserted in series between the inverting input terminal of the operational amplifier 110 and the connection node between the current detection resistor 310 and the capacitor 132. The connection section 320 plays a role of adjusting the frequency characteristics of the feedback amount of the negative feedback performed via the filter current feedback circuit 300.

The above is the configuration of the power amplifier 1 according to this embodiment.

Next, the operation of this embodiment will be described. In the class D amplification section 100, phase rotation is applied to the output signal of the output stage 120 via the filter 130 and the feedback resistor 140, and the output signal is fed back to the operational amplifier 110 serving as the input section. Hence, the class D amplification section 100 performs self-oscillation. The class D amplification section 100 is designed so that its self-oscillation frequency is sufficiently higher than the frequency band of the input audio signal AIN.

The waveform of the output signal of the output stage 120 is a rectangular wave, and the first-order integration of this rectangular wave is performed by the capacitor 132 in the filter 130, whereby the waveform of the signal at the node 133 becomes a triangular wave. In the operational amplifier 110, the triangular wave at the node 133 fed back via the feedback resistor 140 is compared with the input audio signal AIN. As a result, the PWM pulse train having been pulse-width modulated on the basis of the input audio signal AIN is output from the operational amplifier 110, and the PWM pulse train is then output to the filter 130 via the output stage 120. The PWM pulse train passes through the filter 130, whereby the high-frequency components thereof are eliminated, and the PWM pulse train is then supplied to the speaker SP.

More specifically, in the case that the voltage value of the input audio signal AIN is 0 V, the PWM pulse train having a duty ratio of 50% is output from the output stage 120, and the voltage to be applied to the speaker SP becomes 0 V. Furthermore, when the voltage value of the input audio signal AIN changes from 0 V in the positive direction, the duty ratio of the PWM pulse train to be output from the output stage 120 changes from 50% to the maximum, 100%, whereby the voltage to be applied to the speaker SP changes from 0 V to the maximum, +B. On the other hand, when the voltage value of the input audio signal AIN changes from 0 V in the negative direction, the duty ratio of the PWM pulse train to be output from the output stage 120 changes from 50% to the minimum, 0%, whereby the voltage to be applied to the speaker SP changes from 0 V to the minimum, −B. In this way, a signal having a waveform similar to that of the input audio signal AIN is applied to the speaker SP.

While the amplification operation by the above-mentioned class D amplification section 100 is performed, the load current feedback circuit 200 negatively feeds back the load current flowing in the speaker SP to the operational amplifier 110 serving as the input section of the class D amplification section 100, and the filter current feedback circuit 300 negatively feeds back the current flowing in the filter 130 to the operational amplifier 110. As a result, the following advantages are obtained.

Figure 10:
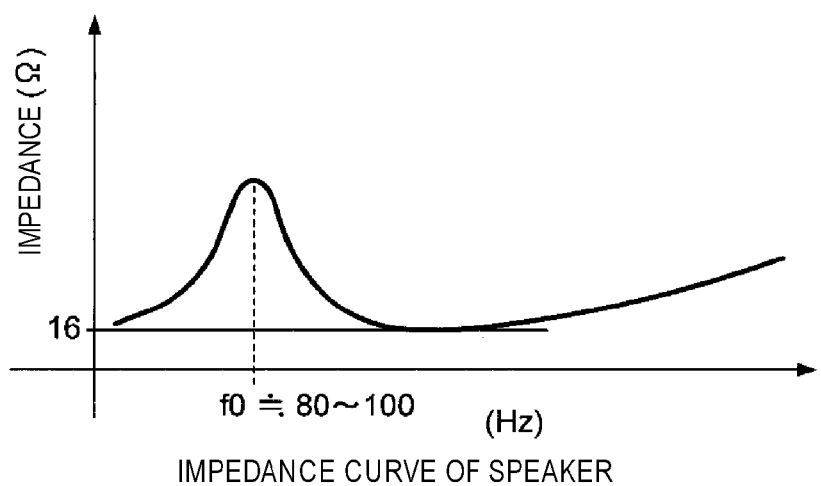
FIG. 10 is a graph illustrating the frequency characteristics of the impedance of the full-range speaker.
Figure 11A:
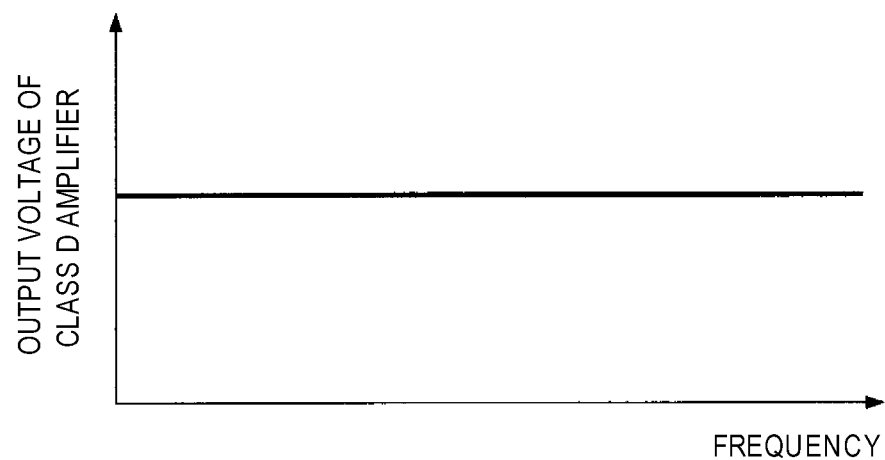
FIGS. 11A and 11B are graphs illustrating the frequency characteristics of the output voltages of the class D amplifier and the vacuum tube amplifier.
Figure 11B:
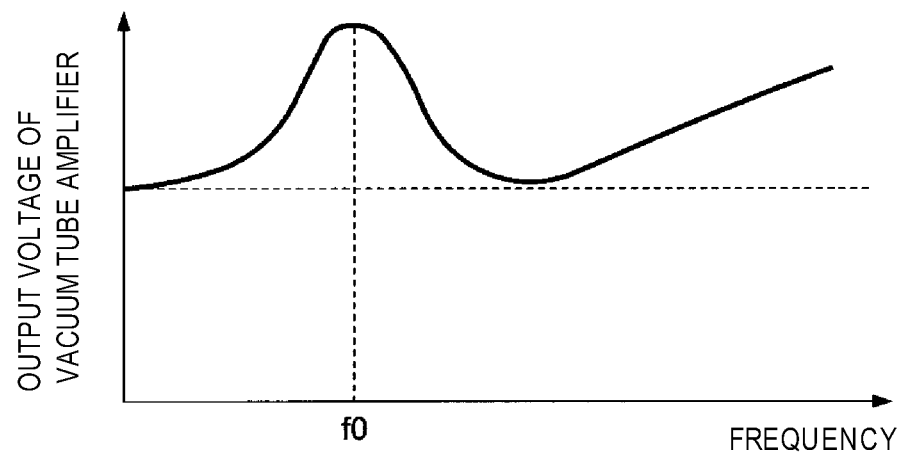

As shown in FIG. 10, the impedance of the speaker SP changes depending on the drive frequency of the speaker SP. When the impedance of the speaker SP increases due to the change in the drive frequency of the speaker SP and the load current flowing in the speaker SP decreases, the feedback signal to be fed to the input section of the class D amplification section 100 via the load current feedback circuit 200 decreases and the output signal of the class D amplification section 100 increases. As a result, the effective voltage to be applied from the class D amplification section 100 to the speaker SP increases, whereby the load current flowing in the speaker SP increases. On the other hand, when the impedance of the speaker SP decreases due to the change in the drive frequency of the speaker SP and the load current flowing in the speaker SP increases, the feedback signal to be fed to the input section of the class D amplification section 100 via the load current feedback circuit 200 increases and the output signal of the class D amplification section 100 decreases. As a result, the effective voltage to be applied from the class D amplification section 100 to the speaker SP decreases, whereby the load current flowing in the speaker SP decreases. As a result of this feedback control, the load current flowing in the speaker SP becomes constant regardless of the drive frequency of the speaker SP.

As described above, in this embodiment, the output impedance of the class D amplification section 100 can be increased effectively and the load current to be passed through the speaker SP from the class D amplification section 100 can be made constant by negatively feeding back the load current flowing in the speaker SP to the input section of the class D amplification section 100. Hence, in the frequency band near the frequency f0=80 to 100 Hz in which the impedance of the speaker SP increases, a sufficient load current can be passed through the speaker SP and sound emission at a large volume can be realized. In addition, since the control for keeping the load current to be passed through the speaker SP constant is performed regardless of the drive frequency of the speaker SP in this embodiment, it is possible to prevent excessively large current from flowing in the speaker SP in the frequency bands other than the frequency band near the frequency f0=80 to 100 Hz, whereby the speaker SP can be prevented from being broken. As described above, with this embodiment, sound reproduction with high quality at a large volume that can be realized by using only a vacuum tube amplifier can be realized by using the power amplifier 1 utilizing semiconductor devices.

Furthermore, with this embodiment, an advantage capable of preventing the decrease in the self-oscillation frequency of the class D amplification section 100 can be obtained. This advantage will be described in detail as follows. First, in such a self-oscillating amplifier as the class D amplification section 100, its self-oscillation frequency is required to be adjusted to a frequency (for example, 200 to 500 kHz) higher than the audio frequency band (20 kHz or less) by adjusting its open loop gain characteristics and phase characteristics. However, since the main feedback route in this embodiment is the load current feedback circuit 200, and the contribution rate of the voltage feedback in the feedback route is small. Hence, the impedance at the output node 133 of the filter 130 serving as the point of the voltage feedback becomes low, and the open-loop gain characteristics serving as one element affecting the self-oscillation frequency are degraded. As a result, the self-oscillation frequency becomes a frequency (for example, 30 to 50 kHz) lower than the intended self-oscillation frequency (for example, 200 to 500 kHz) if no measures are taken. Hence, in this embodiment, the filter current feedback circuit 300 is provided in addition to the load current feedback circuit 200.

In the filter 130, the current flowing into the capacitor 132 connected in parallel with the speaker SP serving as a load is generated by the high-frequency components that are higher than the LC resonance frequency of the filter 130 in the PWM pulses to be output from the output stage 120. The high-frequency open-loop gain characteristics having been degraded can be raised by feeding back the current flowing in the capacitor 132 of the filter 130, whereby the self-oscillation frequency of the class D amplification section 100 can be adjusted to a self-oscillation frequency equivalent to the conventional self-oscillation frequency that is not provided with the load current feedback circuit 200.

Moreover, since the power amplifier 1 according to this embodiment is composed of semiconductor devices, unlike the vacuum tube amplifier, the power amplifier 1 is compact in size, light in weight and convenient in handling. Still further, since the power amplifier 1 according to this embodiment uses the class D amplification section 100 being characterized in that the loss in the output stage 120 thereof is low, unlike the vacuum tube amplifier, the power amplifier 1 can drive the speaker SP at high efficiency.

<Second Embodiment>

Figure 2:
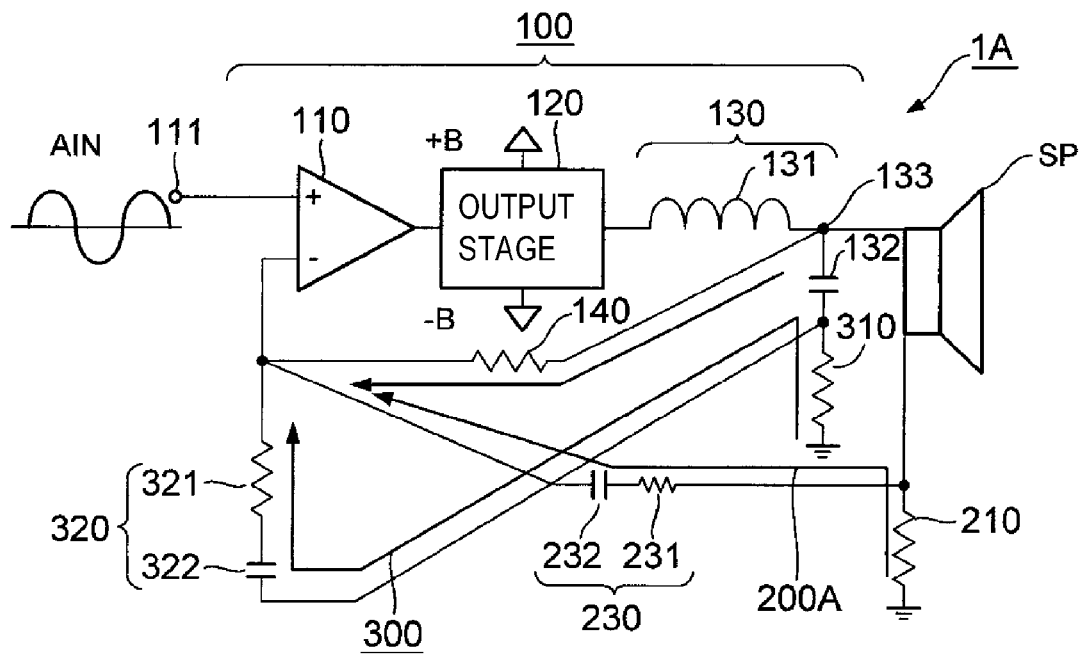
FIG. 2 is a circuit diagram showing a configuration of a power amplifier according to a second embodiment of the present invention.

FIG. 2 is a circuit diagram showing a configuration of a power amplifier 1A according to a second embodiment of the present invention. In FIG. 2, components corresponding to those according to the above-mentioned first embodiment (FIG. 1) are designated by common numerals and their descriptions are omitted.

In the power amplifier 1A according to this embodiment, the load current feedback circuit 200 according to the above-mentioned first embodiment is replaced with a load current feedback circuit 200A having no amplification section 220. In the case that a sufficiently high voltage is generated across both the terminals of the current detection resistor 210, the amplification section 220 (FIG. 1) can be omitted and the configuration of the circuit can be simplified as in this embodiment.

Advantages similar to those obtained in the above-mentioned first embodiment can also be obtained in this embodiment.

<Third Embodiment>

Figure 3:
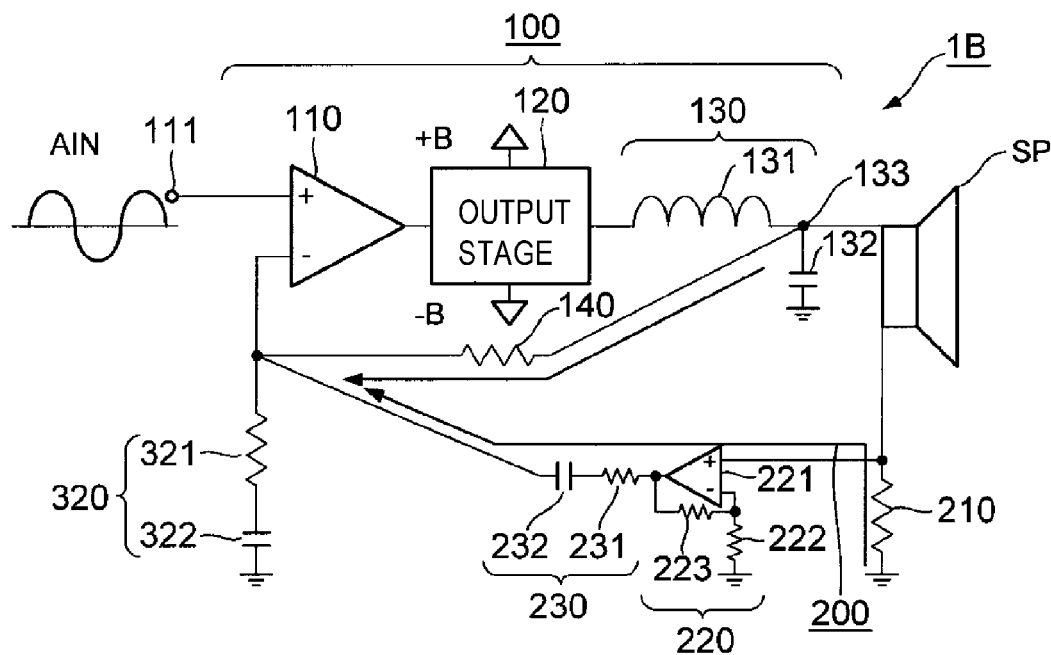
FIG. 3 is a circuit diagram showing a configuration of a power amplifier according to a third embodiment of the present invention.

FIG. 3 is a circuit diagram showing a configuration of a power amplifier 1B according to a third embodiment of the present invention. In FIG. 3, components corresponding to those according to the above-mentioned first embodiment (FIG. 1) are designated by common numerals and their descriptions are omitted.

The power amplifier 1B according to this embodiment does not have the filter current feedback circuit 300 according to the above-mentioned first embodiment. Since the power amplifier does not have the filter current feedback circuit 300, the terminal of the capacitor 132 in the filter 130 on the opposite side of the node 133 is grounded directly. Furthermore, the resistor 321 and the capacitor 322 included in the filter current feedback circuit 300 in the above-mentioned first embodiment are inserted in series between the non-inverting input terminal of the operational amplifier 110 and the grounding wire. The reason why the resistor 321 and the capacitor 322 are not eliminated but left to be used is to make the frequency characteristics of the load current feedback circuit 200 identical to those in the above-mentioned first embodiment.

Since the filter current feedback circuit 300 is not provided in this embodiment, the signal of the voltage feedback route via the feedback resistor 140 is required to be made larger than the signal in the route of the load current feedback circuit 200 in order to set the self-oscillation frequency to a high frequency. In this case, the output impedance of the amplifier is higher than that of an ordinary class D amplifier, although the output impedance is not as high as the output impedance in the first embodiment but keeps a certain degree of output impedance (for example, a dozen or so ohms), thereby being advantageous in that the circuit configuration is made simpler than that of the first embodiment. Also in this embodiment, the amplification section 220 may be omitted as in the above-mentioned second embodiment.

<Fourth Embodiment>

Figure 4:
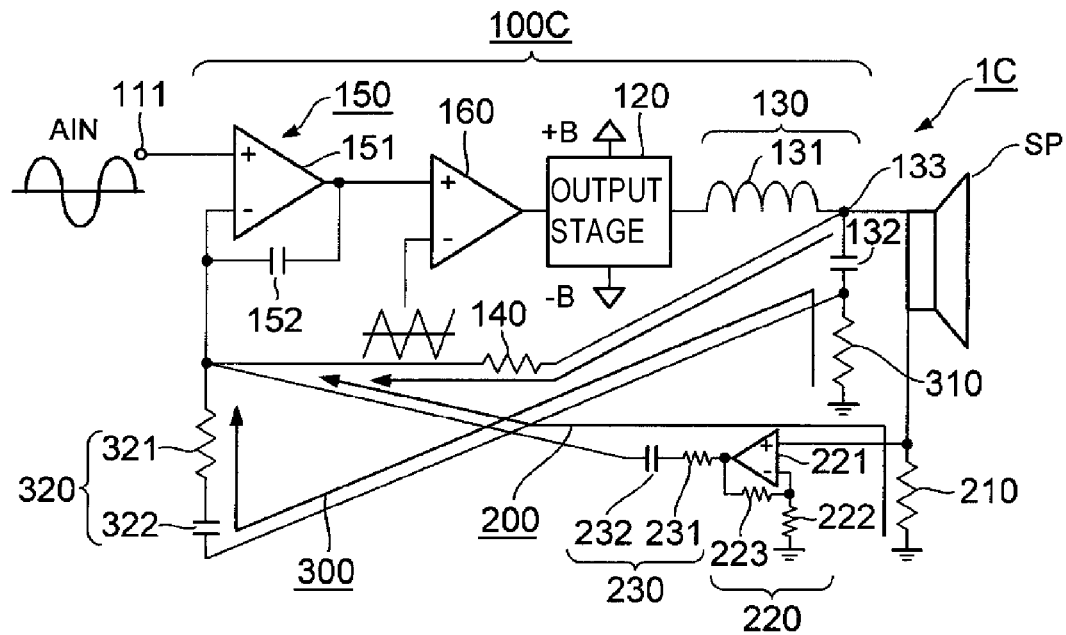
FIG. 4 is a circuit diagram showing a configuration of a power amplifier according to a fourth embodiment of the present invention.

FIG. 4 is a circuit diagram showing a configuration of a power amplifier 1C according to a fourth embodiment of the present invention. In FIG. 4, components corresponding to those according to the above-mentioned first embodiment (FIG. 1) are designated by common numerals and their descriptions are omitted.

In the power amplifier 1C according to this embodiment, the self-oscillating class D amplification section 100 in the above-mentioned first embodiment is replaced with a separately-excited oscillating class D amplification section 100C. In this class D amplification section 100C, the operational amplifier 110 in the class D amplification section 100 according to the above-mentioned first embodiment is replaced with an error integrator 150 and a comparator 160.

The error integrator 150 is composed of an operational amplifier 151 and an integration capacitor 152 inserted between the output terminal and the inverting input terminal of this operational amplifier 151. The input audio signal AIN is applied from the input terminal 111 to the non-inverting input terminal of the operational amplifier 151. Furthermore, to the inverting input terminal of the operational amplifier 151, the output voltage is fed back from the speaker SP via the feedback resistor 140, the load current flowing in the speaker SP is fed back via the load current feedback circuit 200, and the current flowing in the filter 130 is fed back via the filter current feedback circuit 300. The error integrator 150 integrates the error between the input audio signal AIN and the feedback signal to be fed back via each of the feedback circuits and outputs an integration value signal.

To the inverting input terminal of the comparator 160, a periodic carrier signal having a frequency sufficiently higher than the frequency band of the input audio signal AIN is applied from a carrier signal generation circuit, not shown. Although this carrier signal is a triangular wave signal in the example shown in the figure, a sawtooth wave signal may also be used as the carrier signal. The comparator 160 compares the carrier signal with the integration value signal output from the error integrator 150 and outputs a PWM pulse train having been pulse-width modulated on the basis of the integration value signal to the output stage 120. The functions of the output stage 120 and the filter 130 are similar to those described in the above-mentioned first embodiment.

Advantages similar to those obtained in the above-mentioned first embodiment can also be obtained in this embodiment. Unlike the above-mentioned first embodiment, in this embodiment, it is necessary to securely obtain a phase margin at a unity gain frequency in which the loop gain of the class D amplification section 100C becomes 0 dB and to prevent the class D amplification section 100C from performing self-oscillation in the high-frequency band. Hence, in this embodiment, it is necessary to raise the open-loop gain characteristics in the high-frequency band as in the case of the conventional voltage feedback type class D amplifier that is not provided with the load current feedback circuit 200. In this embodiment, since the current flowing in the capacitor 132 of the filter 130 is negatively fed back by the filter current feedback circuit 300, the open-loop gain characteristics of the class D amplification section 100C in the high-frequency band are raised, the phase margin at the unity gain frequency is obtained securely, whereby stability can be enhanced and free-running oscillation can be prevented.

<Fifth Embodiment>

Figure 5:
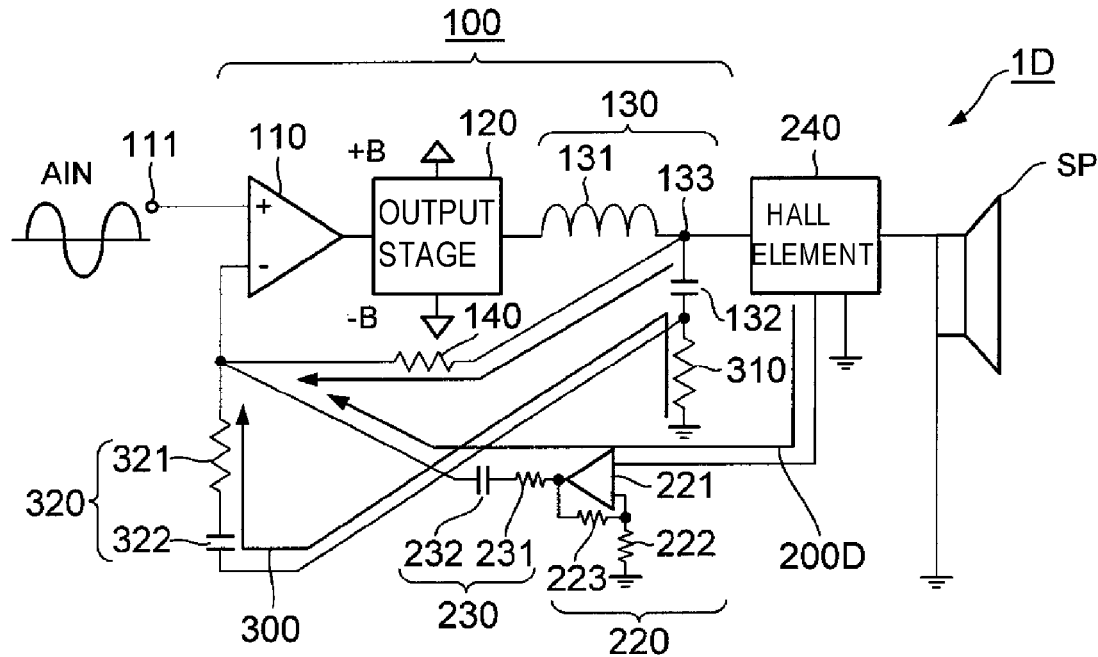
FIG. 5 is a circuit diagram showing a configuration of a power amplifier according to a fifth embodiment of the present invention.

FIG. 5 is a circuit diagram showing a configuration of a power amplifier 1D according to a fifth embodiment of the present invention. In FIG. 5, components corresponding to those according to the above-mentioned first embodiment (FIG. 1) are designated by common numerals and their descriptions are omitted.

In this power amplifier 1D, the load current feedback circuit 200 according to the above-mentioned first embodiment is replaced with a load current feedback circuit 200D. This load current feedback circuit 200D has a configuration in which the current detection resistor 210 is omitted from the load current feedback circuit 200, and instead of the resistor, a Hall element 240 is inserted between the node 133 of the filter 130 and the speaker SP. Since the purpose of inserting the Hall element 240 between the node 133 of the filter 130 and the speaker SP is to monitor the current flowing in the speaker SP, the Hall element 240 may be inserted between the speaker and the ground.

The Hall element 240 detects the magnetic field that is generated when current flows through the signal wire connecting the node 133 of the filter 130 to the speaker SP and outputs the voltage corresponding to the intensity of the magnetic field. The amplification section 220 and the connection section 230 feed back the output voltage of the Hall element 240, that is, the voltage corresponding to the load current flowing in the speaker SP, to the operational amplifier 110 serving as the input section of the class D amplification section 100.

As a result, advantages similar to those obtained in the above-mentioned first embodiment can also be obtained in this embodiment. Furthermore, since the current detection resistor 210 according to the above-mentioned first embodiment is not necessary in this embodiment, the power to be supplied to the speaker SP can be raised by the amount of the power consumed by the resistor.

Although the Hall element is provided as a detector for detecting the load current flowing in the speaker SP in this embodiment, in addition to the Hall element, a Hall element may also be used as a detector for detecting the current flowing in the filter 130. For example, it may be possible that the current detection resistor 310 shown in FIG. 5 is omitted, that a Hall element is inserted at an arbitrary position in the route of the current flowing in the capacitor 132, and that the output voltage of this Hall element is supplied to the connection section 320.

<Sixth Embodiment>

Figure 6:
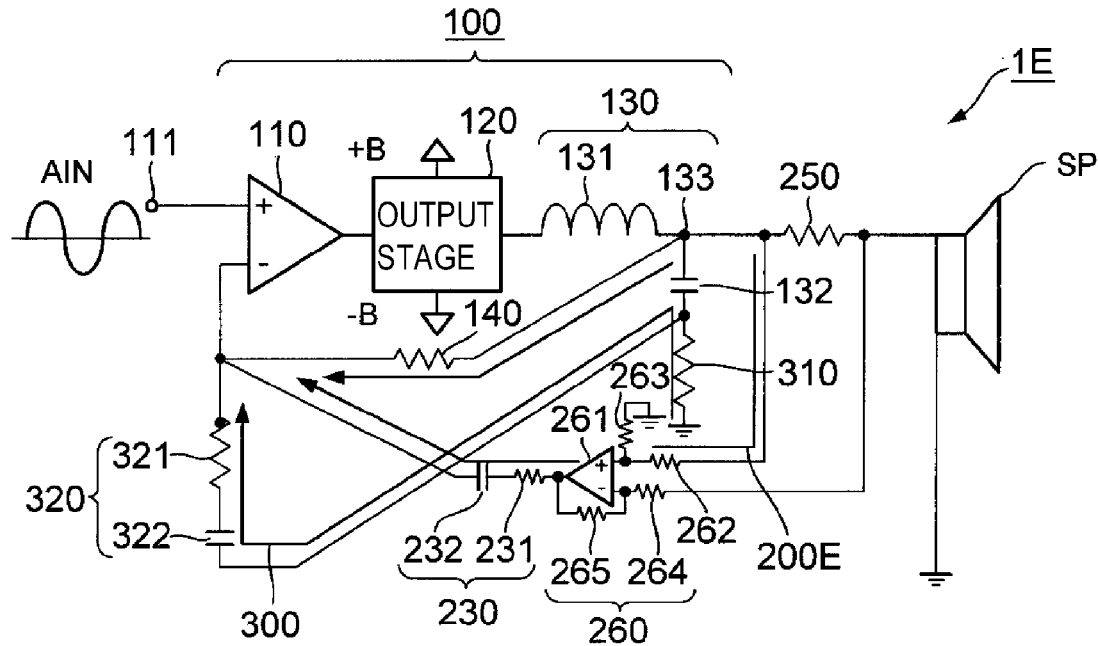
FIG. 6 is a circuit diagram showing a configuration of a power amplifier according to a sixth embodiment of the present invention.

FIG. 6 is a circuit diagram showing a configuration of a power amplifier 1E according to a sixth embodiment of the present invention. In FIG. 6, components corresponding to those according to the above-mentioned first embodiment (FIG. 1) are designated by common numerals and their descriptions are omitted.

In this power amplifier 1E, the load current feedback circuit 200 according to the above-mentioned first embodiment is replaced with a load current feedback circuit 200E. This load current feedback circuit 200E has a configuration in which the current detection resistor 210 is omitted from the load current feedback circuit 200, and instead of the resistor, a current detection resistor 250 is inserted between the node 133 of the filter 130 and the speaker SP, and furthermore, the amplification section 220 of the load current feedback circuit 200 is replaced with an amplification section 260. Since the current detection resistor 210 is omitted, the terminal of the speaker SP on the opposite side of the resistor 250 is grounded directly.

The amplification section 260 is composed of an operational amplifier 261 and resistors 262 to 265. The non-inverting input terminal of the operational amplifier 261 is connected to the terminal of the current detection resistor 250 on the side of the filter 130 via the resistor 262 and is grounded via the resistor 263. Furthermore, the inverting input terminal of the operational amplifier 261 is connected to the terminal of the current detection resistor 250 on the side of the speaker SP via the resistor 264 and is also connected to the output terminal of the operational amplifier 261 via the resistor 265. The amplification section 260 outputs a voltage proportional to the voltage across both the terminals of the current detection resistor 250. Moreover, the output voltage of the amplification section 260, that is, the voltage corresponding to the load current flowing in the speaker SP, is fed back to the operational amplifier 110 serving as the input section of the class D amplification section 100 via the connection section 320.

Advantages similar to those obtained in the above-mentioned first embodiment can also be obtained in this embodiment.

<Seventh Embodiment>

Figure 7:
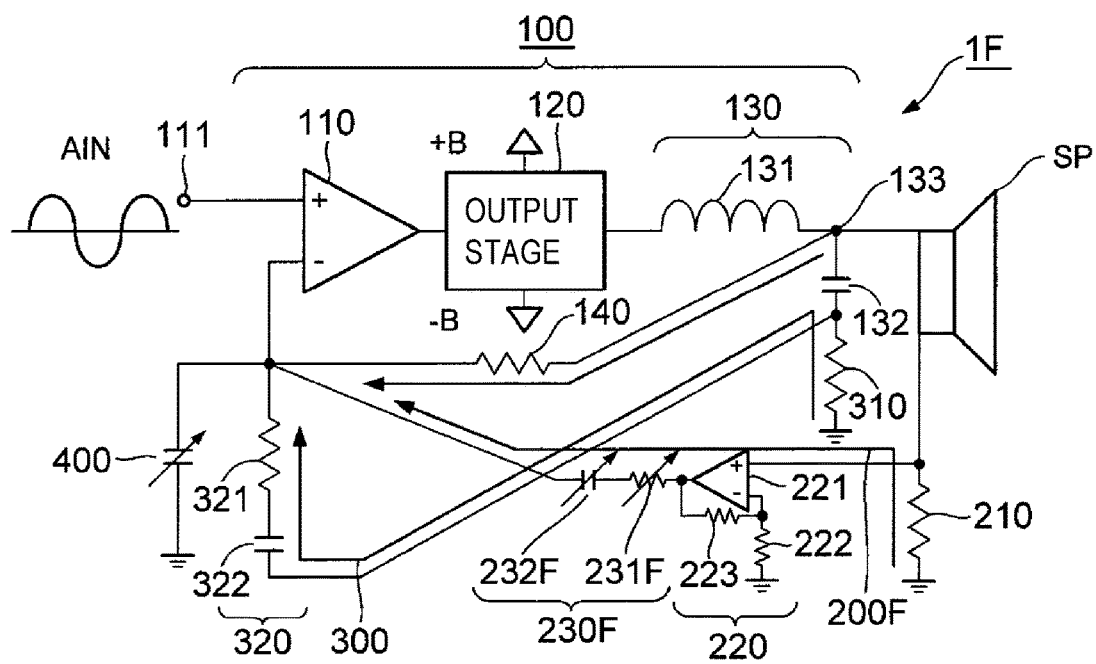
FIG. 7 is a circuit diagram showing a configuration of a power amplifier according to a seventh embodiment of the present invention.

FIG. 7 is a circuit diagram showing a configuration of a power amplifier 1F according to a seventh embodiment of the present invention. In FIG. 7, components corresponding to those according to the above-mentioned first embodiment (FIG. 1) are designated by common numerals and their descriptions are omitted.

In this power amplifier 1F, the load current feedback circuit 200 according to the above-mentioned first embodiment is replaced with a load current feedback circuit 200F. Furthermore, in this load current feedback circuit 200F, the connection section 230 in the load current feedback circuit 200 is replaced with a connection section 230F in which variable elements capable of adjusting electric characteristics, more specifically, a variable resistor 231F capable of adjusting a resistance value and a variable capacitor 232F capable of adjusting a capacitance value, are connected in series. Moreover, in the power amplifier 1F, a variable capacitor 400 inserted between the inverting input terminal of the operational amplifier 110 and the grounding wire is added.

Figure 8:
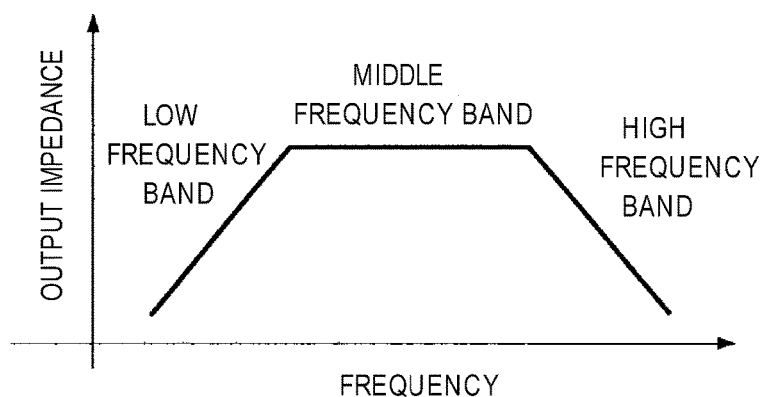
FIG. 8 is a graph illustrating the frequency characteristics of the output impedance of the class D amplification section according to the seventh embodiment.

This embodiment is intended to realize acoustic reproduction similar to that obtained using a vacuum tube amplifier for driving a speaker via a transformer. FIG. 8 is a graph illustrating the frequency characteristics of the output impedance in the entire system of the vacuum tube amplifier and the transformer. As shown in FIG. 8, the output impedance of the vacuum tube amplifier for driving the speaker via the transformer (the output impedance in the entire system of the transformer and the vacuum tube amplifier as viewed from the speaker) decreases due to the inductance component of the transformer in the low frequency band and also decreases due to the capacitance component of the transformer in the high frequency band. In the middle frequency band between the low and high frequency bands, the value of the output impedance in the entire system of the transformer and the vacuum tube amplifier is maintained high.

In this embodiment, the variable resistor 231F and the variable capacitors 232F and 400 play a role of easily bringing the frequency characteristics of the output impedance of the class D amplification section 100 close to the frequency characteristics of the output impedance in the entire system of the transformer and the vacuum tube amplifier.

More specifically, in this embodiment, when the capacitance value of the variable capacitor 232F is increased, the lower limit frequency of the frequency band in which the negative feedback amount via the load current feedback circuit 200F becomes a predetermined amount or more (that is, the middle frequency band in which the output impedance of the class D amplification section 100 becomes high) becomes low. Hence, the boundary frequency between the middle frequency band and the low frequency band can be adjusted by increasing and decreasing the capacitance value of the variable capacitor 232F.

In addition, the adjustment of the negative feedback amount via the load current feedback circuit 200F in the middle frequency band can be performed by increasing and decreasing the resistance value of the variable resistor 231F. The output impedance of the class D amplification section 100 in the middle frequency band can be adjusted by increasing and decreasing the resistance value of the variable resistor 231F.

Furthermore, when the capacitance value of the variable capacitor 400 is increased, the upper limit frequency of the middle frequency band in which the negative feedback amount via the load current feedback circuit 200F and the filter current feedback circuit 300 becomes a predetermined amount or more becomes low. Hence, the boundary frequency between the middle frequency band and the high frequency band can be adjusted by increasing and decreasing the capacitance value of the variable capacitor 400.

With this embodiment described above, in addition to the advantages obtained in the above-mentioned first embodiment, an advantage is obtained in which the frequency characteristics of the output impedance of the class D amplification section 100 can be easily brought close to the frequency characteristics of the output impedance in the entire system of the transformer and the vacuum tube amplifier.

The frequency characteristics of the output impedance of the vacuum tube amplifier including the transformer become different depending on the characteristics of the vacuum tube to be used for the vacuum tube amplifier. Hence, power amplifiers having frequency characteristics simulating the frequency characteristics of the output impedances of various kinds of vacuum tube amplifiers composed of different vacuum tubes may also be realized by adjusting the variable resistor 231F and the variable capacitors 232F and 400.

<Eighth Embodiment>

Figure 9:
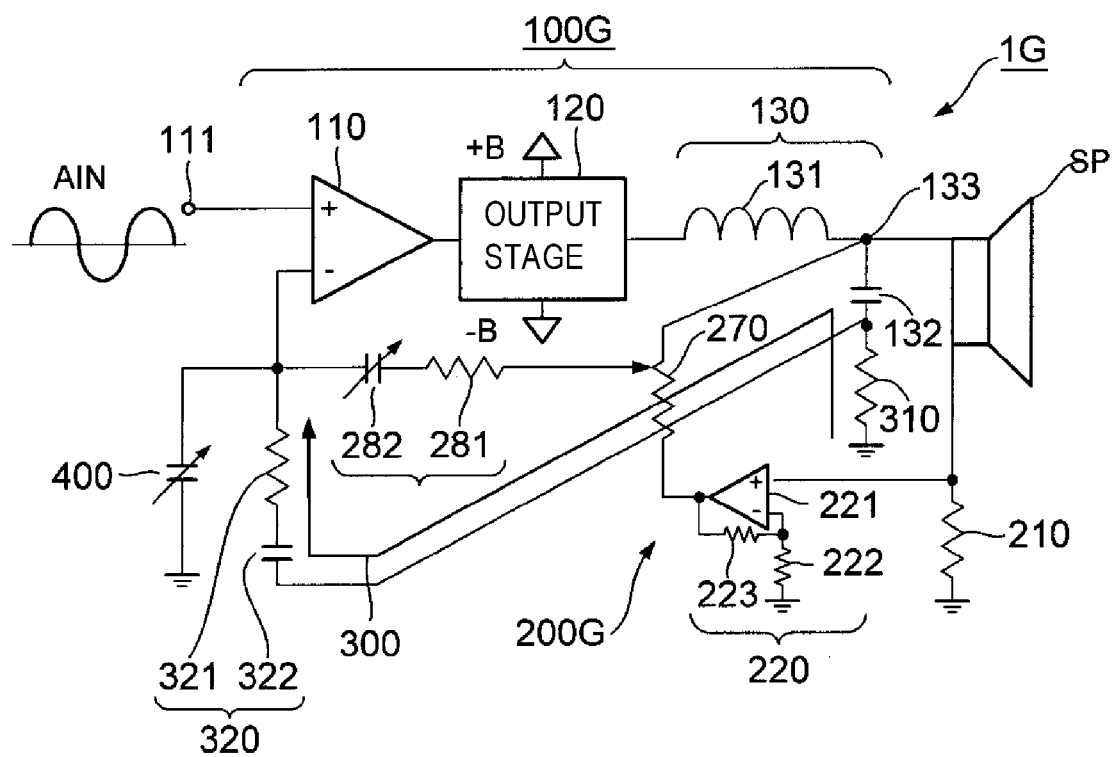
FIG. 9 is a circuit diagram showing a configuration of a power amplifier according to an eighth embodiment of the present invention.

FIG. 9 is a circuit diagram showing a configuration of a power amplifier 1G according to an eighth embodiment of the present invention. In FIG. 9, components corresponding to those according to the above-mentioned first embodiment (FIG. 1) are designated by common numerals and their descriptions are omitted.

In this power amplifier 1G, the class D amplification section 100G thereof has a configuration in which the feedback resistor 140 is omitted from the class D amplification section 100 according to the above-mentioned first embodiment. Furthermore, in this embodiment, the load current feedback circuit 200 according to the above-mentioned first embodiment is replaced with a voltage-current feedback circuit 200G. Moreover, in this embodiment, a variable capacitor 400 similar to that in the above-mentioned seventh embodiment is inserted between the inverting input terminal of the operational amplifier 110 and the grounding wire.

The voltage-current feedback circuit 200G has a current detection resistor 210 and an amplification section 220 similar to those used in the load current feedback circuit 200 (FIG. 1). Furthermore, a variable resistor 270 is inserted between the output terminal of the amplification section 220 and the node 133 of the filter 130. This variable resistor 270 outputs, from its slider, the voltage obtained by internally dividing the voltage between the output terminal of the amplification section 220 and the node 133 of the filter 130. The internal division ratio of the variable resistor 270 can be adjusted by changing the position of the slider between both the terminals of the variable resistor 270. The output voltage at the slider of the variable resistor 270 is fed back to the inverting input terminal of the operational amplifier 110 via a connection section 280 in which a resistor 281 and a variable capacitor 282 are connected in series.

In this embodiment, both the negative feedback of the output voltage for the speaker SP to the operational amplifier 110 (hereafter simply referred to as voltage feedback for convenience) and the negative feedback of the load current flowing in the speaker SP to the operational amplifier 110 (hereafter simply referred to as current feedback for convenience) are performed by the voltage-current feedback circuit 200G. In the case that the slider of the variable resistor 270 is brought close to the terminal connected to the node 133, the feedback amount of the voltage feedback increases and the feedback amount of the current feedback decreases. Conversely, in the case that the slider of the variable resistor 270 is brought close to the terminal to which the output terminal of the amplification section 220 is connected, the feedback amount of the current feedback increases and the feedback amount of the voltage feedback decreases.

As described above, with this embodiment, since the balance between the feedback amount of the voltage feedback and the feedback amount of the current feedback can be adjusted, an advantage of increasing the degree of freedom in adjusting the frequency characteristics of the output impedance of the power amplifier is obtained.

Still further, in this embodiment, a variable resistor 282 is provided in the voltage-current feedback circuit 200G and the variable capacitor 400 is inserted between the inverting input terminal of the operational amplifier 110 and the grounding wire. Hence, like the above-mentioned seventh embodiment, an advantage is obtained in which the frequency characteristics of the output impedance of the class D amplification section 100 can be easily brought close to the frequency characteristics of the output impedance in the entire system of the transformer and the vacuum tube amplifier.

The features of the above-described power amplifier according to the embodiments of the invention will be summarized below as respective items [1]-[6].

[1] The present invention provides a power amplifier: comprising:

a class D amplification section that includes an input section and a switching section serving as an output stage and switched depending on a signal input to the input section, and that outputs current from a power source to a load via the switching section; and a load current feedback circuit that negatively feeds back the current flowing in the load to the input section of the class D amplification section.

With the above configuration of the item [1], since the class D amplification section is used, a loss of the output stage of the power amplifier can be decreased. Furthermore, since the current flowing in the load is negatively fed back to the input section of the class D amplification section, a constant drive current can be supplied to the load regardless of the frequency of a current for driving the load.

[2] The power amplifier recited in the item [1], further comprising: a filter current feedback circuit that negatively feeds back a current flowing in a filter interposed between the output stage of the class D amplification section and the load to the input section of the class D amplification section.

With the above configuration of the item [2], by negatively feeding back the current flowing in the filter, the output impedance of the class D amplification section can be raised even at a high frequency and the open-loop gain thereof can be prevented from lowering, whereby the self-oscillation frequency of the class D amplification section can be raised or the class D amplification section is prevented from performing self-oscillation.

[3] The power amplifier recited in items [1] or [2], wherein the load current feedback circuit comprises:

a negative feedback amount adjustor which adjusts a balance between a negative feedback amount of the voltage for the load to be negatively fed back to the input section of the class D amplifier and a negative feedback amount of the current flowing in the load to be negatively fed back to the input section of the class D amplifier.

[4] The power amplifier recited in any one of items [1] to [3], wherein a variable element configured to adjust electric characteristics is included in a route in which the signal is negatively fed back to the input section of the class D amplification section.

[5] The power amplifier recited in any one of items [1] to [4], wherein the class D amplification section is a self-oscillating amplifier.

[6] The power amplifier recited in any one of items [1] to [4], wherein the class D amplification section is a separately-excited oscillating amplifier.

What is claimed is:

1. A power amplifier comprising:
   a class D amplification section that includes an input section and a switching section serving as an output stage and switched depending on a signal input to the input section, and that outputs current from a power source to a load via the switching section;
   a load current feedback circuit that feeds back a current flowing in the load to a negative terminal of the input section of the class D amplification section; and
   a filter current feedback circuit that feeds back a current flowing in a filter to the negative terminal of the input section of the class D amplification section;
   wherein the filter is interposed between the output stage of the class D amplification section and the load;
   wherein the filter comprises an inductor and a capacitor;
   wherein the inductor is inserted between an output terminal of the output stage and the load so as to be connected in series to the output stage and the load; and
   wherein one terminal of the capacitor is connected to a node between the inductor and the load.

2. The power amplifier according to claim 1, wherein the load current feedback circuit comprises:
   a negative feedback amount adjustor which adjusts a balance between a feedback amount of a voltage for the load to be fed back to the negative terminal of the input section of the class D amplifier and a feedback amount of the current flowing in the load to be fed back to the negative terminal of to the input section of the class D amplifier.

3. The power amplifier according to claim 1, wherein a variable element configured to adjust electric characteristics is located in a path of the load current feedback circuit.

4. The power amplifier according to claim 1, wherein the class D amplification section is a self-oscillating amplifier.

5. The power amplifier according to claim 1, wherein the class D amplification section is a separately-excited oscillating amplifier.

* * * * *